United States Patent
Shabbir et al.

(10) Patent No.: US 10,130,014 B2
(45) Date of Patent: Nov. 13, 2018

(54) SYSTEMS AND METHODS FOR THERMAL MANAGEMENT OF AN INFORMATION HANDLING SYSTEM USING CORRELATIONS BETWEEN FAN SPEED AND FLOW RATE BASED ON SYSTEM CONFIGURATION

(71) Applicant: Dell Products L.P., Round Rock, TX (US)

(72) Inventors: Hasnain Shabbir, Round Rock, TX (US); Dominick A. Lovicott, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 168 days.

(21) Appl. No.: 15/074,373

(22) Filed: Mar. 18, 2016

(65) Prior Publication Data

US 2017/0273224 A1 Sep. 21, 2017

(51) Int. Cl.
*H05K 7/20* (2006.01)
*G05B 15/02* (2006.01)

(52) U.S. Cl.
CPC ......... *H05K 7/20836* (2013.01); *G05B 15/02* (2013.01)

(58) Field of Classification Search
CPC .............................. H05K 7/20836; G05B 15/02
See application file for complete search history.

(56) References Cited

U.S. PATENT DOCUMENTS

| | | | |
|---|---|---|---|
| 7,184,925 B2 | 2/2007 | Augustin et al. | |
| 7,222,043 B2 | 5/2007 | Augustin et al. | |
| 7,421,623 B2 | 9/2008 | Haugh | |
| 7,878,888 B2 | 2/2011 | Rasmussen et al. | |
| 7,941,283 B2 | 5/2011 | Gross et al. | |
| 8,180,501 B2* | 5/2012 | Lewis ................ | G05D 23/1919 454/184 |
| 8,403,736 B2 | 3/2013 | Rasmussen et al. | |
| 8,416,571 B2* | 4/2013 | Mizumura ......... | H05K 7/20836 361/679.48 |
| 9,459,015 B2 | 10/2016 | Karamanos et al. | |
| 2004/0257766 A1 | 12/2004 | Rasmussen et al. | |
| 2007/0129000 A1 | 6/2007 | Rasmussen et al. | |
| 2007/0188282 A1 | 8/2007 | Folts et al. | |

(Continued)

OTHER PUBLICATIONS

International Search Report and Written Opinion of the International Searching Authority, International Application No. PCT/US2017/016844, dated Apr. 13, 2017.

*Primary Examiner* — Charles Kasenge
(74) *Attorney, Agent, or Firm* — Jackson Walker L.L.P.

(57) ABSTRACT

A system may include a plurality of temperature sensors configured to sense temperatures at a plurality of locations associated with an information handling system, a cooling subsystem comprising at least one cooling fan configured to generate a cooling airflow in the information handling system and a thermal manager communicatively coupled to the plurality of temperature sensors and the cooling subsystem. The thermal manager may be configured to, based on at least a power provided to a subsystem of the information handling system, estimate a thermal condition proximate to the subsystem and set a speed of the at least one cooling fan based on the estimated thermal condition and a required linear airflow velocity associated with the subsystem.

20 Claims, 14 Drawing Sheets

(56) References Cited

U.S. PATENT DOCUMENTS

| | | |
|---|---|---|
| 2009/0006659 A1 | 1/2009 | Collins et al. |
| 2009/0014546 A1 | 1/2009 | Yasuo |
| 2009/0044027 A1 | 2/2009 | Piazza |
| 2009/0061756 A1 | 3/2009 | Germagian |
| 2009/0097200 A1 | 4/2009 | Sharma et al. |
| 2009/0296342 A1 | 12/2009 | Matteson et al. |
| 2010/0076607 A1 | 3/2010 | Ahmed et al. |
| 2010/0139360 A1 | 6/2010 | Gross et al. |
| 2010/0315223 A1 | 12/2010 | Gross et al. |
| 2012/0084551 A1 | 4/2012 | Cheng |
| 2012/0140402 A1* | 6/2012 | Mizumura ......... H05K 7/20836 361/679.33 |
| 2014/0277818 A1* | 9/2014 | Peterson ................. G06F 1/206 700/300 |
| 2014/0324380 A1* | 10/2014 | Otsuka ................ G01M 99/002 702/136 |
| 2015/0058409 A1* | 2/2015 | Wang ....................... H04L 67/06 709/203 |
| 2016/0011607 A1* | 1/2016 | James .................... G05B 15/02 700/300 |
| 2016/0037686 A1* | 2/2016 | Shabbir .................. G06F 1/206 700/300 |
| 2016/0066471 A1 | 3/2016 | Zhang et al. |
| 2016/0239067 A1* | 8/2016 | Lovicott .............. G06F 1/3206 |

\* cited by examiner

ENERGY BALANCE TABLE

| ENERGY BALANCE NUMBER | DESCRIPTION | CONFIGURATION MATCH | PWM TO? (CFM/LFM) | EXHAUST SENSOR? (T_EXHAUST OR PCIe_INLET) | CROSS-SECTIONAL AREA FOR LFM CALCULATION [IN FT$^2$] | SYSTEM AIRFLOW AND EXHAUST REPORTING |
|---|---|---|---|---|---|---|
| EB1 | REPORT SYSTEM AIRFLOW - 24 DRIVE NP | 1,2,3,4 | CFM | T_EXHAUST | | X |
| EB2 | REPORT SYSTEM AIRFLOW - 12 DRIVE NP | 5,6,7 | CFM | T_EXHAUST | | X |
| EB3 | X4 PCI COOLING | 15 | LFM | T_EXHAUST | 0.133 | |
| EB4 | X8 PCI COOLING | 16 | LFM | T_EXHAUST | 0.133 | |
| ooo | ooo | ooo | ooo | ooo | ooo | ooo |

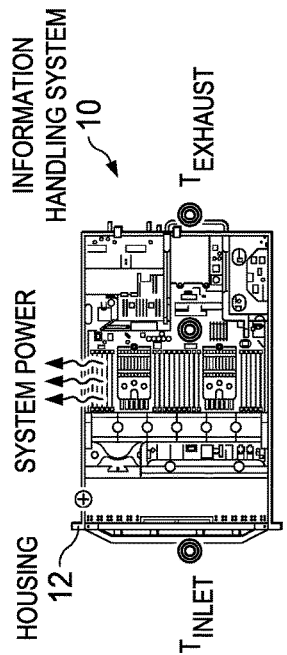

INFORMATION HANDLING SYSTEM 10
HOUSING 12
$T_{INLET}$, SYSTEM POWER, $T_{EXHAUST}$

EXHAUST TEMPERATURE ENERGY BALANCE — 52

$T\_exhaust = (1.76 \times POWER/CFM) + T_{INLET}$ — 58

POWER — 54:
$POWER = \sum_{n=0}^{n} POWER \times SCALING FACTOR + \ldots + P_{static}$
n : iDRAC ITERATION AIRFLOW — 56:
$CFM_{BASE} = A \times PWM^4 + B \times PWM^3 + C \times PWM^2 + D \times PWM + E$
$CFM = CFM_{BASE} \times (1 + SCALING FACTOR \times COMPONENT COUNT) \times \ldots$

| ENERGY BALANCE NUMBER | | | | | | | | | | | | | | | | | |
|---|---|---|---|---|---|---|---|---|---|---|---|---|---|---|---|---|---|
| | TOTAL SYSTEM | CPU SUBSYSTEM | STORAGE SUBSYSTEM | PCI SUBSYSTEM | STATIC POWER VALUE | AVERAGE NUMBER OF READINGS | A | B | C | D | E | FAN COUNT | HDD COUNT | PCIe COUNT | CPU COUNT | MEMORY COUNT | SENSOR NAME |
| | SCALING FACTORS | | | | | N | PWM-TO-CFM CORRELATION | | | | | SCALING FACTORS | | | | | $T_{AMBIENT}$ |
| EB1 | 1 | 0 | 0 | 0 | 0 | 60 | 0 | 0 | 0 | 0.9 | 10 | 0 | -0.008 | 0 | 0 | 0 | |

LFM CORRELATIONS ARE DEFINED HERE AND ARE BASED ON WORST CASE SLOT LFM. THE CALCULATED LFM FROM HERE IS THEN TRANSLATED TO PER-SLOT LFM BASED ON PER-SLOT SCALING FACTORS

LFM:
$$LFM = LFM_{BASE} \times (1 + SF \times COMPONENTCOUNT) \times \ldots$$
$$LFM_{BASE} = A \times PWM^5 + B \times PWM^4 + C \times PWM^3 + D \times PWM^2 + E \times PWM + F$$
FAN SPEED (% PWM) IS AN AVERAGE OF ALL FAN ZONES

| Component | Scaling Factors (SF) |
|---|---|
| MEMORY COUNT | 0 |
| CPU COUNT | 0 |
| PCIe COUNT | 0 |
| HDD COUNT | -0.006 |
| FAN COUNT | 0 |
| LOWER LFM LIMIT (UCL) | |
| LOWER LFM LIMIT (LCL) | |

PWM-TO-CFM CORRELATION (5TH ORDER POLYNOMIAL)

| A | B | C | D | E | F |
|---|---|---|---|---|---|
|  |  |  | 8.3 | 154 | 11 |

FIG. 5B

| SLOT | CARD FORM FACTOR | MAX LANE WIDTH | SCALING FACTOR |
|---|---|---|---|
| 1 | LOW-PROFILE | x4 | 1.5 |
| 2 | LOW-PROFILE | x4 | 1.0 |
| 3 | LOW-PROFILE | x8 | 0.9 |
| 4 | LOW-PROFILE | x8 | 0.5 |
| 5 | FULL-HEIGHT | x16 | 0.75 |
| 6 | FULL-HEIGHT | x16 | 0.75 |
| 7 | FULL-HEIGHT | x16 | 0.7 |
| 8 | FULL-HEIGHT | x16 | 0.7 |

FIG. 10

| SLOT 1 | SLOT 2 | SLOT 3 | SLOT 4 | SLOT 5 | SLOT 6 | FAN SPEED (%PWM) | FAN POWER (W) |
|---|---|---|---|---|---|---|---|
| CARD 1 | CARD 2 | CARD 3 | EMPTY | EMPTY | EMPTY | 81 | 60 |
| *CARD 2* | CARD 3 | EMPTY | EMPTY | EMPTY | CARD 1 | *100* | 90 |
| *CARD 3* | EMPTY | EMPTY | EMPTY | CARD 1 | CARD 2 | *100* | 90 |
| EMPTY | EMPTY | EMPTY | CARD 1 | CARD 2 | CARD 3 | 40 | 16 |
| EMPTY | EMPTY | CARD 1 | CARD 2 | CARD 3 | EMPTY | 43 | 18 |
| EMPTY | CARD 1 | CARD 2 | CARD 3 | EMPTY | EMPTY | 46 | 20 |

FIG. 11

|  | ASSUMED MAXIMUM POWER (W) | |
| --- | --- | --- |
| LANE WIDTH | FULL-HEIGHT | LOW-PROFILE |
| x1 | 10 | 10 |
| x4 | 25 | 25 |
| x8 | 25 | 25 |
| x16 | 75 | 25 |
| x8 + CABLE (PASSIVE) | 75 | 25 |
| x16 + CABLE (PASSIVE) | 75 | 25 |

FIG. 13

|  |  | LFM = $ax^3 + bx^2 + cx + d$, WITH MAX OF e; x = MAXIMUM POWER CONSUMPTION | | | | |
| --- | --- | --- | --- | --- | --- | --- |
|  |  | a | b | c | d | e |
| TOWER | FH | 0 | 0 | 1.9619 | 2.0647 | 149 |
| TOWER | LP | 0 | 0 | 1.9619 | 2.0647 | 149 |
| TOWER | FH AND LP | 0 | 0 | 3.1333 | 2.6667 | 81 |
| RACK | FH | 0 | 0 | 1.9619 | 2.0647 | 149 |
| RACK | LP | 0 | -0.035 | 4.9574 | 15.293 | 191 |
| RACK | FH AND LP | 0 | -0.035 | 4.9574 | 15.293 | 191 |
| MODULAR | FH | 0 | -0.035 | 4.9574 | 15.293 | 191 |
| MODULAR | LP | 0 | -0.035 | 4.9574 | 15.293 | 191 |
| MODULAR | FH AND LP | 0 | -0.035 | 4.9574 | 15.293 | 191 |

FIG. 14

| VENDOR NAME | VENDOR ID | x1 | x4 | x8 | x16 |
|---|---|---|---|---|---|
| VENDOR A | 1000 | 1.0 | 2.0 | 2.0 | 1.0 |
| VENDOR B | 10B5 | 1.0 | 2.0 | 2.0 | 1.0 |
| VENDOR C | 15B3 | 1.0 | 1.5 | 1.5 | 1.0 |
| VENDOR D | 1924 | 1.0 | 1.5 | 1.5 | 1.0 |
| VENDOR E | 14E4 | 1.0 | 1.0 | 1.0 | 1.0 |
| VENDOR F | 1077 | 1.0 | 1.0 | 1.0 | 1.0 |

FIG. 15

SYSTEMS AND METHODS FOR THERMAL MANAGEMENT OF AN INFORMATION HANDLING SYSTEM USING CORRELATIONS BETWEEN FAN SPEED AND FLOW RATE BASED ON SYSTEM CONFIGURATION

TECHNICAL FIELD

The present disclosure relates in general to information handling systems, and more particularly to thermal management of an information handling system at a modular level.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, thermal management systems including air movers (e.g., cooling fans and blowers) have often been used in information handling systems to cool information handling systems and their components. Various input parameters to a thermal management system, such as measurements from temperature sensors and inventories of information handling system components are often utilized by thermal management systems to control air movers and/or throttle power consumption of components in order to provide adequate cooling of components.

However, instances may exist in which a thermal management system may not have sufficient input parameters in order to adequately determine thermal health of various components. For example, Peripheral Component Interconnect (PCI) and other input/output (I/O) cards are a common example of a component that in many typical information handling system topologies, lacks sufficient thermal data in order for efficient thermal control. Thermal control of many such cards typically includes generating an automatic or manually-configured predefined air mover response which is static in nature and does not dynamically take into account varying thermal parameters of an information handling system. A disadvantage of this approach is that it must assume a worst-case scenario, meaning more airflow may be used to cool such I/O cards than may actually be required to operate correctly, leading to wasted electrical power required to operate air movers. Another disadvantage of this approach is that expecting users to manually configure cooling levels for I/O card cooling may be risky and may provide a bad user experience.

As another example, many information handling system components may not be capable of reporting their temperatures. Accordingly, thermal management of such components may include setting minimum open loop air mover speeds which may be defined based on system characterization during design and development of an information handling system, and may require extensive testing to determine optimum air mover speeds.

SUMMARY

In accordance with the teachings of the present disclosure, disadvantages and problems associated with thermal management of an information handling system may be reduced or eliminated.

In accordance with embodiments of the present disclosure, a system may include a plurality of temperature sensors configured to sense temperatures at a plurality of locations associated with an information handling system, a cooling subsystem comprising at least one cooling fan configured to generate a cooling airflow in the information handling system and a thermal manager communicatively coupled to the plurality of temperature sensors and the cooling subsystem. The thermal manager may be configured to, based on at least a power provided to a subsystem of the information handling system, estimate a thermal condition proximate to the subsystem and set a speed of the at least one cooling fan based on the estimated thermal condition and a required linear airflow velocity associated with the subsystem.

In accordance with these and other embodiments of the present disclosure, a method may include sensing temperatures at a plurality of locations associated with an information handling system, and based on at least a power provided to a subsystem of the information handling system, estimating a thermal condition proximate to the subsystem, and setting a speed of at least one cooling fan of a cooling subsystem for generating a cooling airflow in the information handling system based on the estimated thermal condition and a required linear airflow velocity associated with the subsystem.

In accordance with these and other embodiments of the present disclosure, a system may include a plurality of temperature sensors configured to sense temperatures at a plurality of locations associated with an information handling system, a cooling subsystem comprising at least one cooling fan configured to generate a cooling airflow in the information handling system, and a thermal manager communicatively coupled to the plurality of temperature sensors and the cooling subsystem. The thermal manager may be configured to, based on at least a power provided to a subsystem of the information handling system, estimate a thermal condition proximate to the subsystem and set a speed of the at least one cooling fan based on the estimated thermal condition and a required cubic airflow rate associated with the subsystem, wherein the required cubic airflow rate is determined based on a required linear airflow velocity associated with the subsystem and a net cross-sectional area through which the cooling airflow travels.

In accordance with these and other embodiments of the present disclosure, a method may include sensing temperatures at a plurality of locations associated with an information handling system and based on at least a power provided to a subsystem of the information handling system, estimating a thermal condition proximate to the subsystem, and setting a speed of the at least one cooling fan based on the estimated thermal condition and a required cubic airflow rate associated with the subsystem, wherein the required cubic airflow rate is determined based on a required linear airflow velocity associated with the subsystem and a net cross-sectional area through which the cooling airflow travels.

In accordance with these and other embodiments of the present disclosure, a system may include a plurality of temperature sensors configured to sense temperatures at a plurality of locations associated with an information handling system, a cooling subsystem comprising at least one cooling fan configured to generate a cooling airflow in the information handling system, and a thermal manager communicatively coupled to the plurality of temperature sensors and the cooling subsystem. The thermal manager may be configured to, based on at least a power provided to a subsystem of the information handling system, estimate a thermal condition proximate to the subsystem, correlate each of a plurality of components of the subsystem and a linear airflow velocity requirement of the component to a respective speed of the at least one cooling fan required to provide such airflow requirement, and set a speed of the at least one cooling fan based on the respective speeds.

In accordance with these and other embodiments of the present disclosure, a method may include sensing temperatures at a plurality of locations associated with an information handling system and based on at least a power provided to a subsystem of the information handling system, estimating a thermal condition proximate to the subsystem, correlating each of a plurality of components of the subsystem and a linear airflow velocity requirement of the component to a respective speed of the at least one cooling fan required to provide such airflow requirement, and setting a speed of the at least one cooling fan based on the respective speeds.

In accordance with these and other embodiments of the present disclosure, a system may include a plurality of temperature sensors configured to sense temperatures at a plurality of locations associated with an information handling system, a cooling subsystem comprising at least one cooling fan configured to generate a cooling airflow in the information handling system, and a thermal manager communicatively coupled to the plurality of temperature sensors and the cooling subsystem. The thermal manager may be configured to, based on at least a power provided to a subsystem of the information handling system, estimate a thermal condition proximate to the subsystem, based on a maximum power consumption for a component of the subsystem, determine an estimated linear airflow velocity requirement for the component, and set a speed of the at least one cooling fan based on the estimated thermal condition and the estimated linear airflow velocity requirement.

In accordance with these and other embodiments of the present disclosure, a method comprising may include sensing temperatures at a plurality of locations associated with an information handling system, and based on at least a power provided to a subsystem of the information handling system, estimating a thermal condition proximate to the subsystem, based on a maximum power consumption for a component of the subsystem, determining an estimated linear airflow velocity requirement for the component, and setting a speed of at least one cooling fan based on the estimated thermal condition and the estimated linear airflow velocity requirement.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates a user interface for managing thermal conditions of a server information handling system with stored configuration settings of subsystems within the information handling system, in accordance with embodiments of the present disclosure;

FIGS. 5A and 5B illustrates a user interface for estimating system airflow and exhaust temperature based upon conservation of energy within an information handling system housing, in accordance with embodiments of the present disclosure;

FIG. 10 illustrates a table mapping each slot to an associated scaling factor, in accordance with embodiments of the present disclosure;

FIG. 11 illustrates a table wherein each row depicts an example configuration of populating three cards within six slots of a PCI subsystem and cooling fan speeds required to support such configuration, in accordance with embodiments of the present disclosure;

FIG. 13 illustrates a table with an example of mapping a form factor and lane width of a PCI card to an assumed maximum power consumption for such card, in accordance with embodiments of the present disclosure;

FIG. 14 illustrates a table for estimating an airflow requirement in LFM for a card based on maximum power consumptions for different form factors of a card and information handling system platform types for which such card may be installed, in accordance with embodiments of the present disclosure; and FIG. 15 illustrates a table mapping a plurality of card vendors and lane widths for cards of such vendors to an associated scaling factor, in accordance with embodiments of the present disclosure.

DETAILED DESCRIPTION

Preferred embodiments and their advantages are best understood by reference to FIGS. 1-15, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
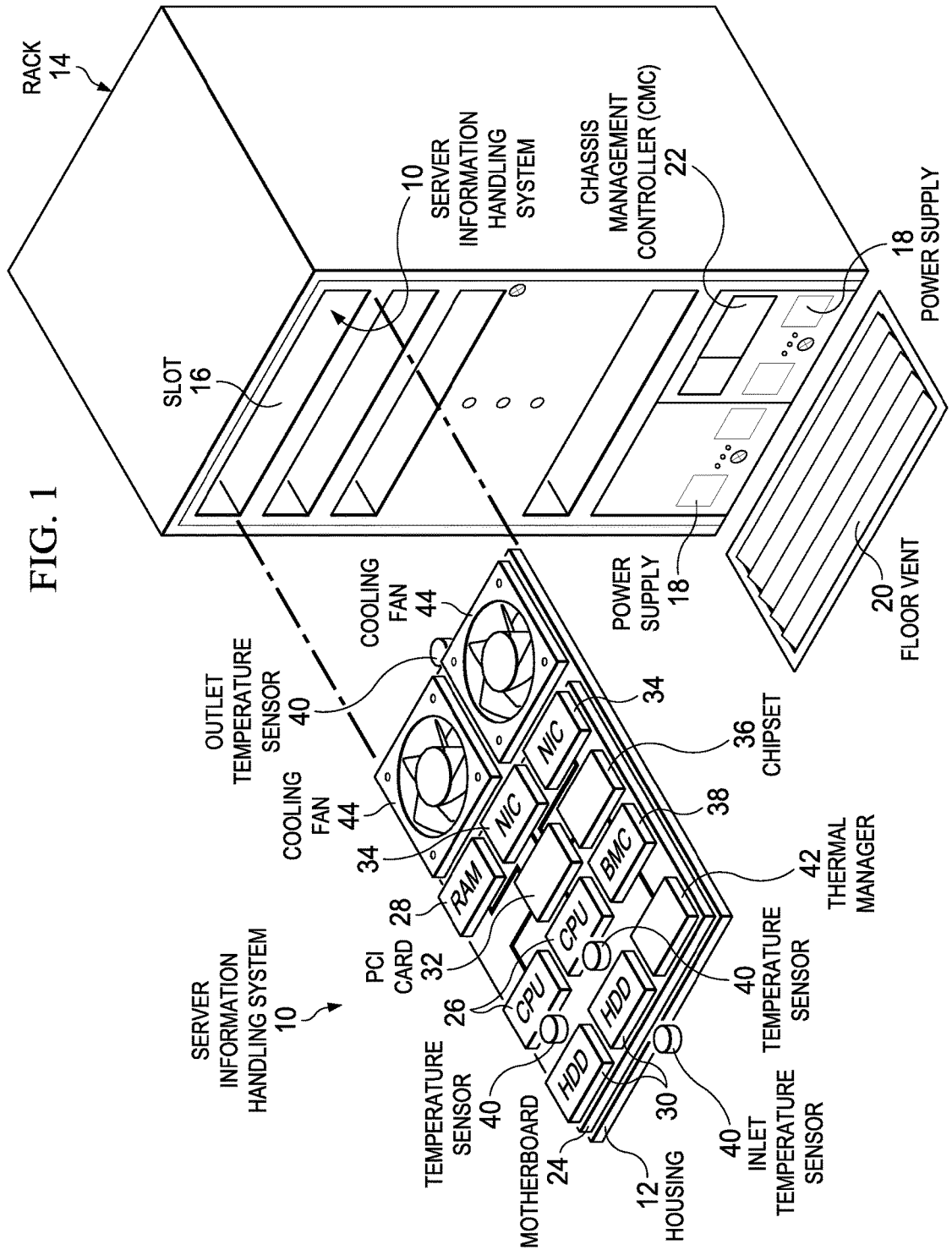
FIG. 1 illustrates a perspective view of an example information handling system, in accordance with embodiments of the present disclosure.

FIG. 1 illustrates a perspective view of an example information handling system 10, in accordance with embodiments of the present disclosure. As shown in FIG. 1, information handling system 10 may comprise a server built into a housing 12 that resides with one or more other information handling systems 10 in a rack 14. Rack 14 may comprise a plurality of vertically-stacked slots 16 that accept information handling systems 10 and a plurality of power supplies 18 that provide electrical energy to information handling systems 10. In a data center environment, rack 14 may receive pretreated cooling air provided from a floor vent 20 to aid removal of thermal energy from information handling systems 10 disposed in rack 14. Power supplies 18 may be assigned power based upon availability at the data center and may allocate power to individual information handling systems 10 under the management of a chassis management controller (CMC) 22. CMC 22 may aid coordination of operating settings so that information handling systems 10 do not exceed thermal or power usage constraints.

Housing 12 may include a motherboard 24 that provides structural support and electrical signal communication for processing components disposed in housing 12 that cooperate to process information. For example, one or more central processing units (CPUs) 26 may execute instructions stored in random access memory (RAM) 28 to process information, such as responses to server requests by client information handling systems remote from information handling system 10. One or more persistent storage devices, such as hard disk drives (HDD) 30 may store information maintained for extended periods and during power off states. A backplane communications manager, such as a PCI card 32, may interface processing components to communicate processed information, such as communications between CPUs 26 and network interface cards (NICs) 34 that are sent through a network, such as a local area network. A chipset 36 may include various processing and firmware resources for coordinating the interactions of processing components, such as a basic input/output system (BIOS). A baseboard management controller (BMC) 38 may interface with chipset 36 to provide out-of-band management functions, such as remote power up, remote power down, firmware updates, and power management. For example, BMC 38 may receive an allocation of power from CMC 22 and monitor operations of the processing components of information handling system 10 to ensure that power consumption does not exceed the allocation. As another example, BMC 38 may receive temperatures sensed by temperature sensors 40 and apply the temperatures to ensure that thermal constraints are not exceeded.

A thermal manager 42 may execute as firmware, software, or other executable code on BMC 38 to manage thermal conditions within housing 12, such as the thermal state at particular processing components or ambient temperatures at discrete locations associated with housing 12. Thermal manager 42 may control the speed at which cooling fans 44 rotate to adjust a cooling airflow rate in housing 12 so that enough excess thermal energy is removed to prevent an over-temperature condition, such as overheating of a CPU 26 or an excessive exhaust temperature as measured by an outlet temperature sensor 40. In the event that cooling fans 44 cannot provide sufficient cooling airflow to meet a thermal constraint, thermal manager 42 may reduce power consumption at one or more of the processing components to reduce the amount of thermal energy released into housing 12, such as by throttling the clock speed of one or more of CPUs 26. Thermal manager 42 may respond to extreme thermal conditions that place system integrity in jeopardy by shutting down information handling system 10, such as might happen if floor vent 20 fails to provide treated air due to a data center cooling system failure.

In order to more effectively manage thermal conditions associated with housing 12, thermal manager 42 may apply conservation of energy to estimate thermal conditions at discrete locations associated within housing 12 and then use the estimated thermal conditions for more precise control of the overall thermal state of information handling system 10. For example, thermal manager 42 may perform one or more energy balances based upon available measures of power consumption, cooling fan speed, and sensed thermal conditions to estimate intermediate temperatures at discrete locations within housing 12. The estimated intermediate temperatures may provide more precise control of the thermal conditions at discrete locations to maintain thermal constraints, such as maximum ambient temperatures of components that do not include temperature sensors or maximum inlet temperatures for components downstream in the cooling airflow from the estimated ambient temperature. Estimated intermediate temperatures may be applied in an overall system conservation of energy model so that fan speed and component power consumption are determined to maintain thermal constraints, such as maximum exhaust temperatures. Thermal manager 42 may estimate discrete thermal conditions at locations within housing 12 by applying available component configuration information, such as a component inventory kept by BMC 38, and sensed, known, or estimated power consumption of the components. For example, BMC 38 may use actual power consumption of components or subassemblies if actual power consumption is available, known power consumption stored in the BMC inventory for known components, or estimated power consumption based upon the type of component and the component's own configuration. An example of estimated power consumption is a general estimate of power consumption stored in BMC 38 for unknown PCI cards 32 with the general estimate based upon the width of the PCI card, i.e., the number of links supported by the PCI card. In one embodiment, as estimated intermediate thermal conditions are applied to generate fan and power consumption settings, a self-learning function may compare expected results and models to component and subassembly thermal characteristics so that more accurate estimates are provided over time.

Figure 2:
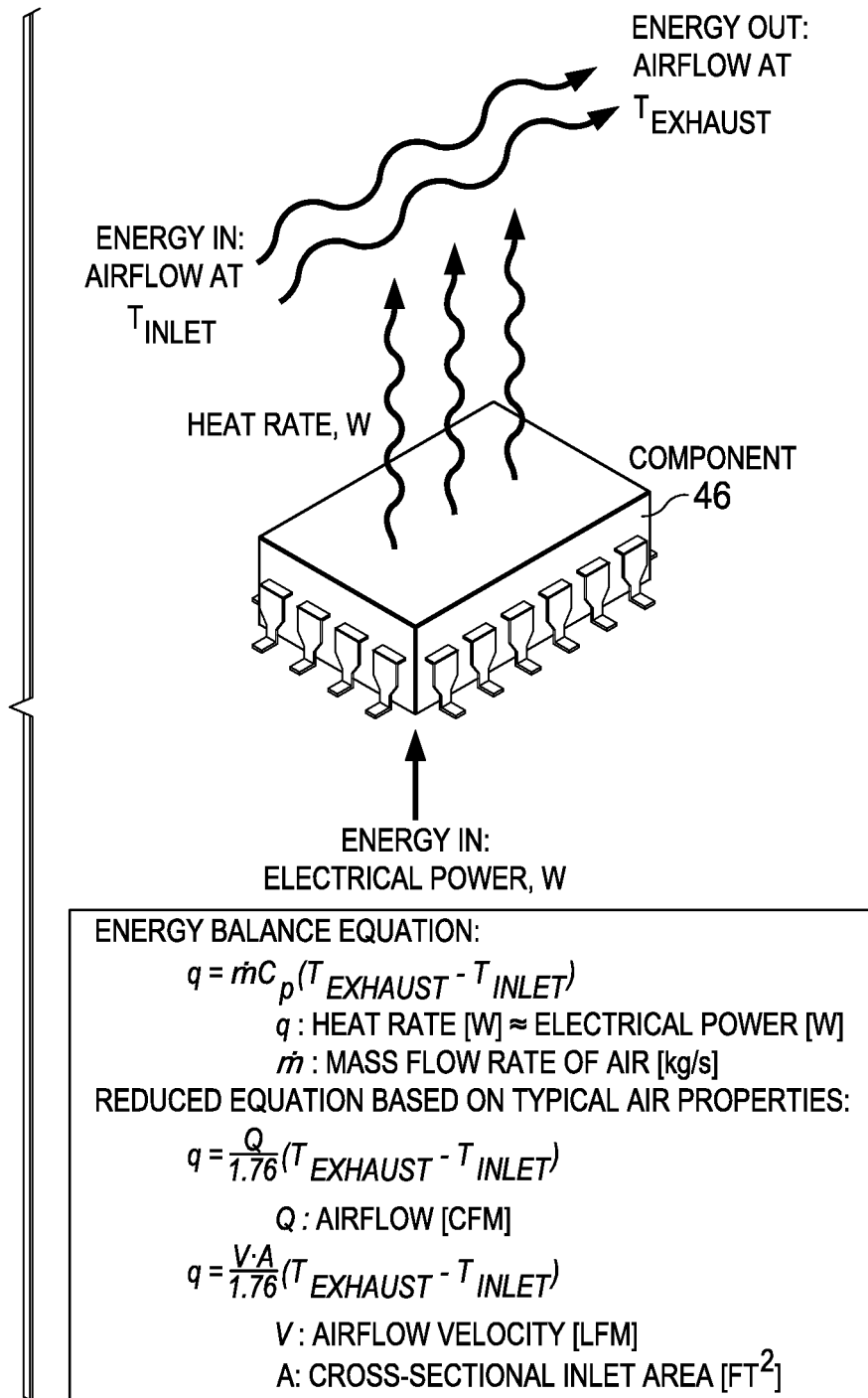
FIG. 2 illustrates a mathematical model for estimating component thermal performance and setting thermal controls, in accordance with embodiments of the present disclosure.

FIG. 2 illustrates a mathematical model for estimating component 46 thermal performance and setting thermal controls, in accordance with embodiments of the present disclosure. According to the law of conservation of energy, the total energy state of an information handling system is maintained as a balance of the energy into the system and the energy out of the system. The energy balance may be broken into a sum of a plurality of components 46 wherein each component 46 has a known or estimated power consumption that introduces thermal energy into the information handling system. The system energy balance becomes the energy into the system as reflected by an airflow inlet temperature, the thermal energy released by the sum of the components 46 that consume power in the system and the energy out of the system as reflected by an airflow exhaust temperature. Energy removed from the system may relate to the mass flow rate of air flowing through the system and the coefficient for energy absorption of the cooling airflow. Simplified for the coefficient that typically applies to atmospheric air, the energy released by electrical power consumption may be equal to airflow in cubic feet per minute divided by a constant of 1.76 and multiplied by the difference between the exhaust temperature and inlet temperature. Alternatively, again simplified for the coefficient that typically applies to atmospheric air, the energy released by electrical power consumption may be equal to a linear airflow velocity in linear feet per minute (which may be calculated as a cubic airflow rate in cubic feet per minute multiplied by an area of an inlet of a component of interest (e.g., cross sectional area of inlet of a card)) divided by a constant of 1.76 and multiplied by the difference between the exhaust temperature and inlet temperature. Thermal manager 42 may apply one or both of these formulas to set cooling fan speed to meet exhaust temperature constraints. For internal components and subassemblies, thermal manager 42 may determine a minimum fan speed to keep ambient temperature of a component within a desired constraint by determining an "inlet" temperature estimated for air as it arrives at the component based upon power consumption of other components in the airflow before the air arrives at the component of interest. The increase in temperature exhausted at the component of interest may be estimated based upon the power consumed by the component of interest and the cooling airflow rate. Thus, a fan speed may be set that prevents an "exhaust" from the component of interest that is in excess of thermal constraints associated with the component. Alternatively, estimated temperatures at intermediate components may be summed and applied to set a fan speed that achieves a desired overall system thermal condition, such as an exhaust temperature constraint.

Applying conservation of energy and component power consumption to manage thermal conditions may allow more precise control of thermal conditions and discrete control within an information handling system housing even where measurements of actual thermal conditions by a temperature sensor are not available. A modular energy balance thermal controller may allow combined serial energy balances to account for the effect of reduced inlet temperatures when increasing speeds for downstream energy balances. This flexibility may be provided by using energy balances independently to solve for either exhaust temperature or airflow on a system-wide basis or at discrete locations within a system. Subsystem power consumption based upon a component or collection of components may allow for estimation of upstream preheat for other components within an information handling system housing. For example, components that do not dissipate substantial heat by power consumption may be scaled to have a reduced impact on airflow temperatures. One example of such a component is a cooling fan, which dissipates 60 to 80% of power consumption as heat and 20 to 40% as air moving, but is generally ignored with conventional thermal controls. By adding fan power and scaling to match efficiency for the system, a more precise picture of thermal conditions within a housing may be provided. Isolating power consumption of specific regions, subsystems or components of interest, such as PCI cards, may allow the power readings for the subsystems to include static power from non-relevant components that are accounted for by subtracting a static power value. Assigning scaled values that relate heat dissipation and power consumption for each subsystem may provide more exact estimates of thermal conditions and more precise control of airflow and power settings based upon preheat that occurs in the airflow as the airflow passes through the housing. Approaching thermal management based upon a serial summation of subsystem thermal conditions supports the use of static values for selected subsystems to subtract thermal overhead or exclude dynamic readings, such as to control fan speed to achieve a static reading instead of monitoring an available dynamic reading.

Using subsystem thermal condition estimates may aid in achieving more accurate fan speed settings for a desired exhaust constraint since airflow-to-fan speed relationships are set based on actual system configuration and component power consumption. Summed energy balances of discrete subsystems disposed in a housing may differentiate thermal control based on hardware inventory, system state, or system events to enhance control accuracy. Airflow may be scaled to account for component count based upon active components and functions being performed at the components during control time periods. When solving for airflow settings needed to meet a component or system-wide thermal constraint, the inlet or exhaust temperature may generally be a fixed requirement that aligns with a temperature limit so that selectively setting static values allows derivation of control values without using available dynamic values. Dynamically calculated inlet ambient with a fixed static exhaust ambient or a fixed inlet ambient and a dynamically calculated exhaust ambient may provide a better estimate of system airflow. As power use fluctuates, feedback and feed forward control of thermal conditions based on average power consumption may dampen cooling fan setting fluctuations that occur when fan settings are made based upon instantaneous power readings alone. Averaging measured fan speeds may also help to simplify correlations and to "learn" thermal characteristics of subsystems as thermal conditions respond over time to changes in power consumption at various subsystems. For example, each fan within a housing can run at different pulse width modulation (PWM) speed settings in which a speed of a fan is based on a duty cycle of a PWM signal received by the fan. Calculating an average PWM from individual fan PWM speed settings may allow a PWM duty cycle to airflow relationship. During operating conditions that have limited availability of dynamically sensed thermal conditions, such as at startup, during fan failure, during sensor failure, and during baseline cooling, estimated subsystem thermal conditions based upon subsystem power consumption may provide a model for fan speed settings. Generally, fan speed setting control based upon a summation of estimated and/or actual subsystem thermal conditions may allow defined minimum fan speeds for a system-wide constraint with supplemental cooling of critical components based on closed loop feedback.

Figure 3:
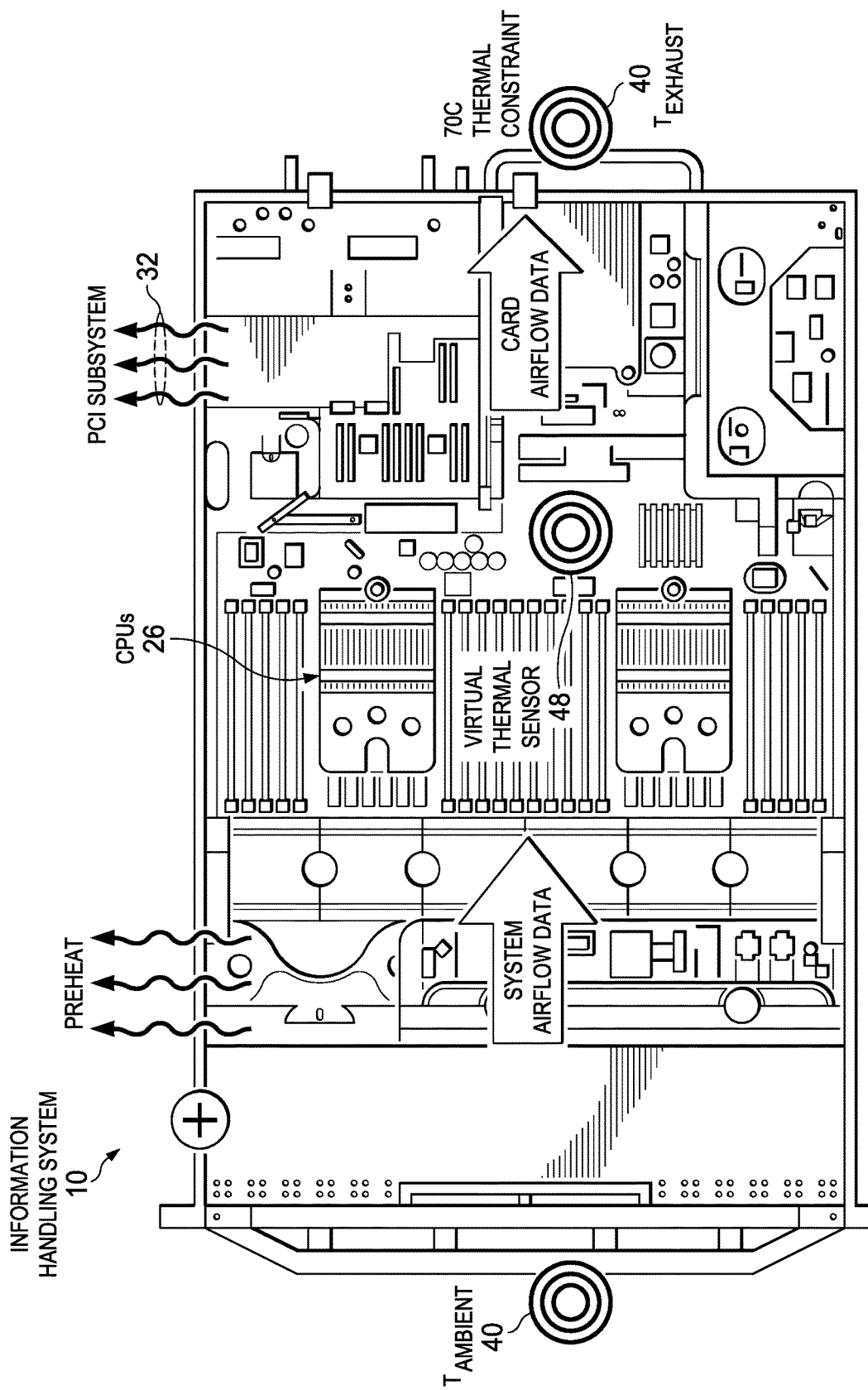
FIG. 3 illustrates a plan view of an example information handling system, in accordance with embodiments of the present disclosure.

FIG. 3 illustrates a plan view of example information handling system 10, in accordance with embodiments of the present disclosure. External air drawn into information handling system 10 may have an ambient temperature ($T_{AMBIENT}$) measured by an inlet temperature sensor 40 and an airflow rate determined by the speed at which one or more cooling fans spin. As the cooling airflow passes through housing 12, it may absorb thermal energy resulting in a preheat of the airflow for downstream components. The cooling airflow may be forced from information handling system 10 at an exhaust with an exhaust temperature ($T_{EXHAUST}$) fixed at thermal constraint (e.g., 70° C.) as a requirement and/or measured by an exhaust temperature sensor 40. Thermal manager 42 may adapt cooling fan speed so that the cooling airflow temperature $T_{EXHAUST}$ maintains a thermal constraint (e.g., 70° C.)

As shown in FIG. 3, a virtual thermal sensor 48 may be generated by thermal manager 42 at a location in information handling system 10 that receives preheated airflow, such as airflow that has passed by CPUs 26. Thermal manager 42 may apply configuration information stored in BMC 38 to determine the components that preheat airflow to virtual thermal sensor 48 and may determine power consumed by the components to arrive at a virtual temperature measured by virtual thermal sensor 48. For example, thermal manager 42 may apply power consumed by CPUs 26 and static power consumption associated with other preheat components to determine by conservation of energy the ambient temperature of air exhausted from CPUs 26 to arrive at the virtual temperature. The virtual temperature may then be used as an inlet temperature to a PCI card subsystem 32 so that an ambient temperature of PCI card subsystem 32 is computed based upon energy consumed by PCI card subsystem 32. PCI card subsystem 32 may exhaust air at temperature $T_{EXHAUST}$ measured by exhaust sensor 40 so that control of the ambient temperature within PCI card subsystem 32 provides control of the overall system exhaust. The increase in thermal energy caused by PCI card subsystem 32 as reflected by the increase from the virtual temperature to the exhaust temperature may be estimated using conservation of energy applied to the energy consumption of PCI card subsystem 32. Generally, PCI card subsystem 32 power consumption may be measured directly based upon power assigned by a power subsystem or estimated with a static value. Alternatively, power consumption may be derived from estimates using conservation of energy applied to known power consumption and thermal conditions in housing 12. Thus, the power consumed by PCI card subsystem 32 may be dynamically determined by actual measurements of power usage, by stored power usage based on the inventory of the PCI card maintained in the BMC, or by an estimate of power consumption based upon characteristics of the PCI card, such as the width of the PCI card.

Having one or more intermediate virtual thermal sensors 48 may provide flexibility in managing system operation by using a virtual temperature measurement as a dynamic thermal control input or a static thermal control constraint. For example, if PCI card subsystem 32 is controlled to have a static value of 50° C., then fan speed and CPU power consumptions may be adjusted to maintain that value. If $T_{EXHAUST}$ has a constraint of 70° C., then excessive temperatures might occur during low CPU power usage due to low fan speed settings needed to maintain the 50° C. virtual thermal sensor 48 measurement and temperature increases of greater than 20° C. from PCI card power consumption. In such an instance, if precise power control is available for desired components, thermal control might focus on $T_{EXHAUST}$ so that the virtual temperature falls below 50° C. or might focus on power consumption by PCI card subsystem 32 so that less thermal energy is released after virtual thermal sensor 48. Typically, PCI card subsystems do not at this time allow control of thermal energy release, such as by throttling a processor clock, however, such capabilities may be introduced for PCI cards or other components in the future. Discrete control of thermal conditions at different locations within information handling system 10 may be provided by generating virtual thermal sensors at the desired locations and then selectively treating the values as dynamic or static for control purposes.

FIG. 4 illustrates a user interface for managing thermal conditions of a server information handling system with stored configuration settings of subsystems within the information handling system, in accordance with embodiments of the present disclosure. Energy balance table 50 may include energy balance parameters for components integral to information handing system 10 as well as estimated values for potential replacement components, such as non-specific PCI cards having a width of four or eight lanes. By including configuration match information that relates components to energy consumption, thermal manager 42 may be able to estimate a thermal condition based on detected components and energy balance information associated with such detected components as set forth in energy balance table 50.

FIGS. 5A and 5B illustrate a user interface for estimating system airflow and exhaust temperature based upon conservation of energy within an information handling system housing, in accordance with embodiments of the present disclosure. An exhaust temperature energy balance table 52 may apply power, cubic airflow, linear airflow velocity, and sensed temperature values to estimate thermal states and set control for desired cubic airflow, linear airflow velocity, and temperature parameters. A power window 54 may depict a power dissipation calculation performed for each subsystem having an energy balance number in energy balance table 50. A total system power dissipation may represent power use by all desired components, which in this example embodiment may include one or more cooling fans. Scaling factors may be set to adjust the relative power consumption in various configuration modes in response to dynamic power settings. A static power setting may also allow control to achieve a desired power setting at a component. A cubic airflow window 56 depicts a mass flow calculation cubic feet per minute (CFM) and a linear airflow velocity window 57 depicts a linear airflow velocity in linear feet per minute (LFM) for determination of cubic airflow or linear airflow velocity to achieve the energy balance with the determined power settings for each component. The example embodiment depicted by FIGS. 5A and 5B may estimate cubic airflow, linear airflow velocity, and exhaust temperatures, including with virtual temperature sensors. In particular, for a given PWM value associated with cooling fans, exhaust temperature energy balance table 52 may correlate such PWM value to an estimated cubic airflow (e.g., in CFM) and/or an estimated linear airflow velocity (e.g., in LFM) for configurations associated with the energy balance number.

Figure 7:
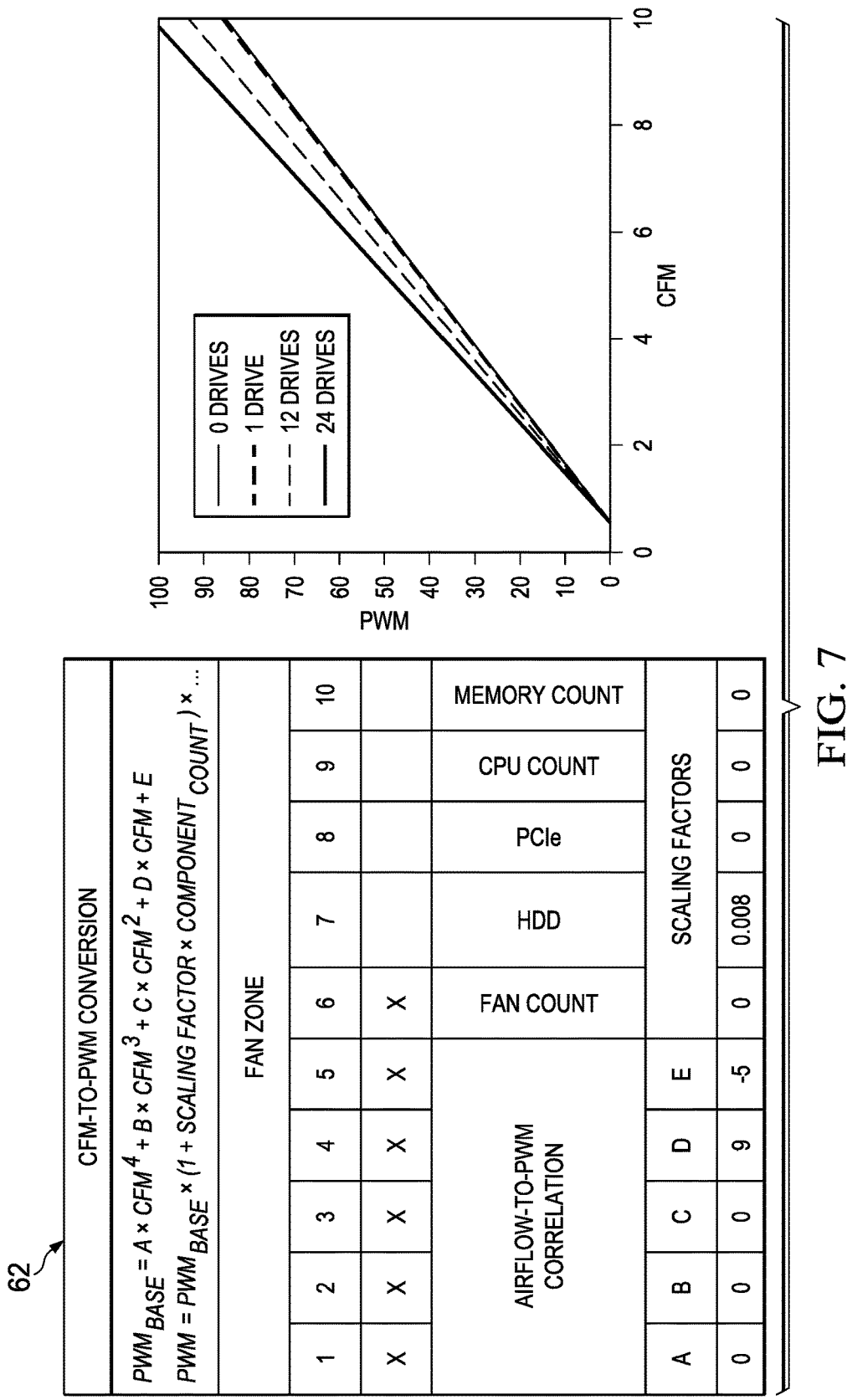
FIG. 7 illustrates a conversion of determined airflow rates to cooling fan pulse width modulation settings, in accordance with embodiments of the present disclosure.

Although FIG. 5B shows estimation of linear airflow velocity based on correlation from PWM values, in some embodiments, linear airflow velocity may be determined from the PWM-to-cubic airflow rate correlation, by dividing the cubic airflow rate correlated to a PWM value by an inlet area of a component of interest (e.g., card). FIG. 7 described below may provide mass airflows converted to cooling fan PWM values to assign cooling fan rotation speeds based upon individual component configurations adjusted for scaling.

Figure 6:
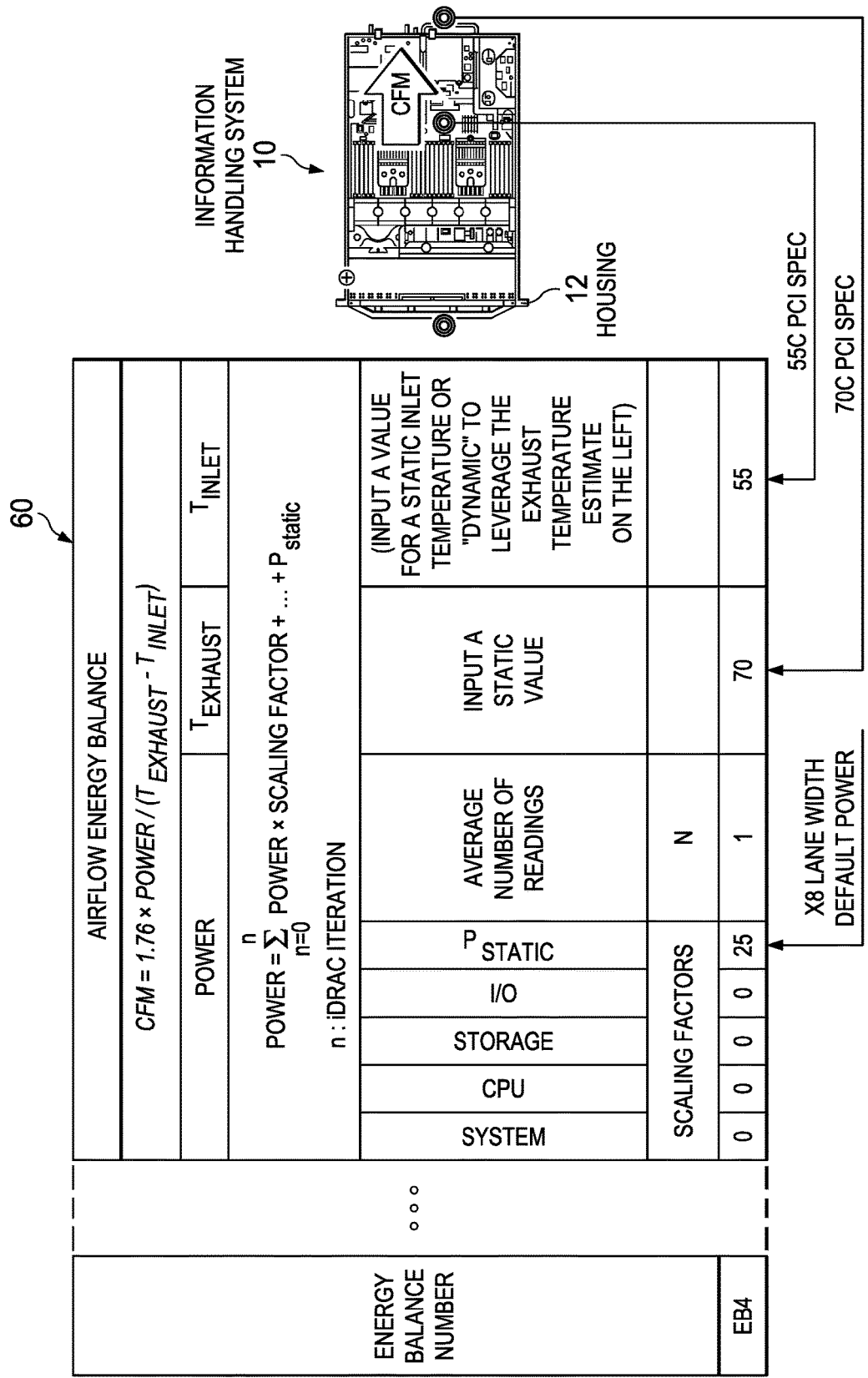
FIG. 6 illustrates a user interface for setting cooling airflow to meet defined conditions, such as temperature defined as a fixed requirement, a measurement read from a sensor or a measurement leveraged from a virtual sensor reading, in accordance with embodiments of the present disclosure.

FIG. 6 illustrates a user interface for setting cooling airflow to meet defined conditions, such as temperature defined as a fixed requirement, a measurement read from a sensor, or a measurement leveraged from a virtual sensor reading, in accordance with embodiments of the present disclosure. The user interface of FIG. 6 may be used by thermal manager 42 to compute how much airflow is required to cool a component. The temperature and power values may be static or dynamic; however, one value may be set to static to support control of the other values to meet a targeted static condition. An airflow energy balance table 60 may support mass airflow and exhaust temperature estimates with dynamic or static settings in the power consumption of the components. An average number of readings input aids in adjusting for thermal lag related to delays between dissipation of power by components and temperature impacts. In the entry for energy balance number EB4 shown in FIG. 6, an exhaust temperature of 70° C. may be set for exhaust from a PCI card based upon a static power setting for a lane width of eight lanes. For example, a lane width of eight lanes may define an estimated power consumption for the card and the 70° C. temperature may define an overall system safety constraint. The entry sets a static inlet temperature for the PCI card of 55° C., such as might be an input limit for the PCI card or so that an airflow rate is determined that maintains the desired exhaust temperature constraint. Alternatively, the inlet temperature may be dynamic from a physical sensor or from a virtual sensor computed with a conservation of energy estimated based upon upstream component power consumption. If the airflow rate is less than another airflow rate required at a different location in housing 12, the constraint may be met without applying the determined airflow rate. For example, if the airflow rate to maintain 55° C. exhaust from the CPUs is greater than the airflow rate required to maintain PCI card thermal conditions, then the CPU airflow rate will apply. In this manner, discrete airflow rates for different portions of information handling system 10 may provide more exact thermal management for components disposed within housing 12.

FIG. 7 illustrates a user interface table 62 for conversion of determined airflow rates to cooling fan pulse width modulation (PWM) settings, in accordance with embodiments of the present disclosure. For example, a graph of different levels of cooling airflow and PWM settings are depicted for different numbers of hard disk drives disposed in housing 12. Such data may be used to set a scaling factor (value of 0.008 under the heading "HDD") in an energy balance entry for a particular energy balance number. Thus, given a particular airflow requirement, whether in CFM or LFM, required cooling fan speeds may be calculated based upon system configuration as detected by BMC 38.

Using the foregoing methods and systems, a cubic airflow rate or linear airflow velocity at a particular point (e.g., at an inlet of PCI subsystem 32) in information handling system 10, may be estimated based on cooling fan speed. Such cubic airflow rate or linear airflow rate may be a "bulk" or average value (e.g., a per PCI slot average value) or a worst case rate (e.g., an value for a "worst case" PCI slot PCI subsystem 32). In addition, using the foregoing methods and systems, given a required cubic airflow rate or linear airflow velocity for a component (e.g., a PCI card), a minimum fan speed required to support such component may be estimated.

While the foregoing description contemplates using energy balances to estimate a linear airflow velocity in LFM based on a cooling fan PWM value, linear airflow velocity in LFM may also be estimated by using an estimate of cubic airflow rate in CFM (e.g., generated using energy balance data from table 52 in FIG. 5) and an estimated cross-sectional area through which the flow of air travels, as described below with respect to FIG. 8.

Figure 8:
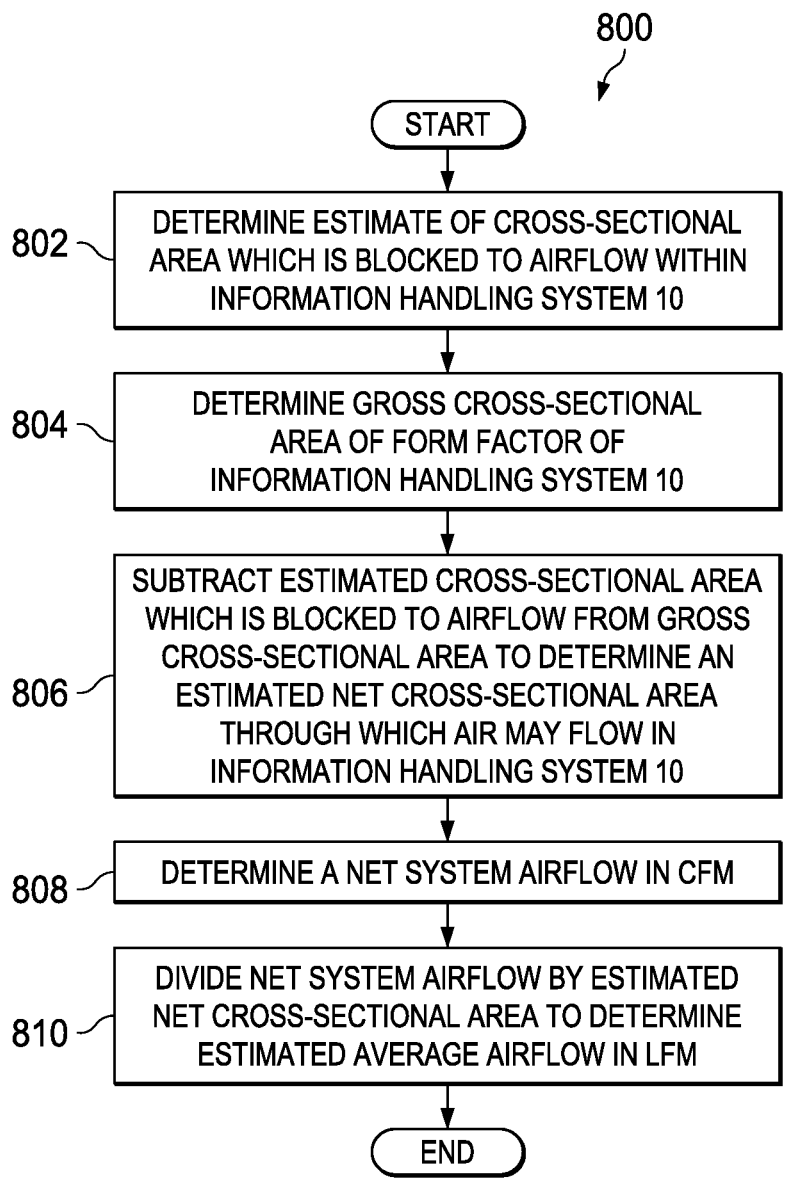
FIG. 8 illustrates a flow chart of an example method for estimating airflow in LFM based on airflow in CFM and an estimated cross-sectional area through which the flow of air travels, in accordance with embodiments of the present disclosure.

FIG. 8 illustrates a flow chart of an example method 800 for estimating linear airflow rate in LFM based on cubic airflow rate in CFM and an estimated cross-sectional area through which the flow of air travels, in accordance with embodiments of the present disclosure. According to some embodiments, method 800 may begin at step 802. As noted above, teachings of the present disclosure may be implemented in a variety of configurations of information handling system 10. As such, the preferred initialization point for method 800 and the order of the steps comprising method 800 may depend on the implementation chosen.

At step 802, thermal manager 42 may, based on a component inventory (e.g., as maintained by BMC 38), determine an estimate of cross-sectional area which is blocked to airflow within information handling system 10. For example, the component inventory met set forth a number of PCI slots in PCI subsystem 32 and which of such PCI slots are populated and the type of PCI card populated (e.g., whether a card is low-profile or full-height, and/or a lane width of the card). Based on this inventory and known, estimated, or assumed physical dimensions of the PCI slots and the PCI cards populating the slots, thermal manager 42 may estimate a cross-sectional area of PCI components that would block airflow through information handling system 10. In addition, similar estimates may be made with respect to other components and/or systems (e.g., power supply unit inventory, network card inventory, etc.) to determine their respective cross section area that would block airflow through information handling system 10. Thermal manager 42 may aggregate the respective cross-sectional areas of all such components and subsystems to determine the overall estimate of cross-sectional area which is blocked to airflow within information handling system 10.

At step 804, thermal manager 42 may, based on a form factor of rack 14, slot 16, and housing 12, determine a gross cross-sectional area of the form factor of information handling system 10, which may essentially be a cross-sectional area of information handling system 10 through which air would flow in the absence of blockage by components accounted for in step 802 above.

At step 806, thermal manager 42 may subtract the estimated cross-sectional area which is blocked to airflow from the gross cross-sectional area to determine an estimated net cross-sectional area through which air may flow in information handling system 10.

At step 808, thermal manager 42 may determine a net system cubic airflow rate in CFM. In some embodiments, such net system cubic airflow rate may be determined in accordance with energy balance data from table 52 in FIG. 5 to correlate speed of a cooling fan to cubic airflow rate in CFM, as described in greater detail above.

At step 810, thermal manager 42 may divide the net cubic system airflow rate by the estimated net cross-sectional area to determine an estimated average linear airflow velocity in LFM. After completion of step 810, method 800 may end.

Although FIG. 8 discloses a particular number of steps to be taken with respect to method 800, method 800 may be executed with greater or fewer steps than those depicted in FIG. 8. In addition, although FIG. 8 discloses a certain order of steps to be taken with respect to method 800, the steps comprising method 800 may be completed in any suitable order.

Method 800 may be implemented using one or more information handling systems 10, components thereof, and/or any other system operable to implement method 800. In certain embodiments, method 800 may be implemented partially or fully in software and/or firmware embodied in computer-readable media.

Although the foregoing methods and systems permit estimation of an average or worst case linear airflow velocity in LFM based on a cooling fan speed and estimation of a required cooling fan speed based on a worst-case LFM-based required linear airflow velocity, slot-by-slot airflow estimation may be performed by applying per-slot scaling factors based on an inventory of each slot (e.g., for PCI slots, whether the slot is populated with a card, whether the card is low-profile or full-height, and/or a lane width of the card) to the average or worst-case LFM estimates. Accordingly, linear airflow velocity may be optimized on a slot-by-slot basis instead of cooling fan speed being set based on a worst-case linear airflow velocity requirement, which may reduce required airflow needed to support airflow velocity requirements of cards, and thus decrease power consumption needed to generate required cooling.

Figure 9:
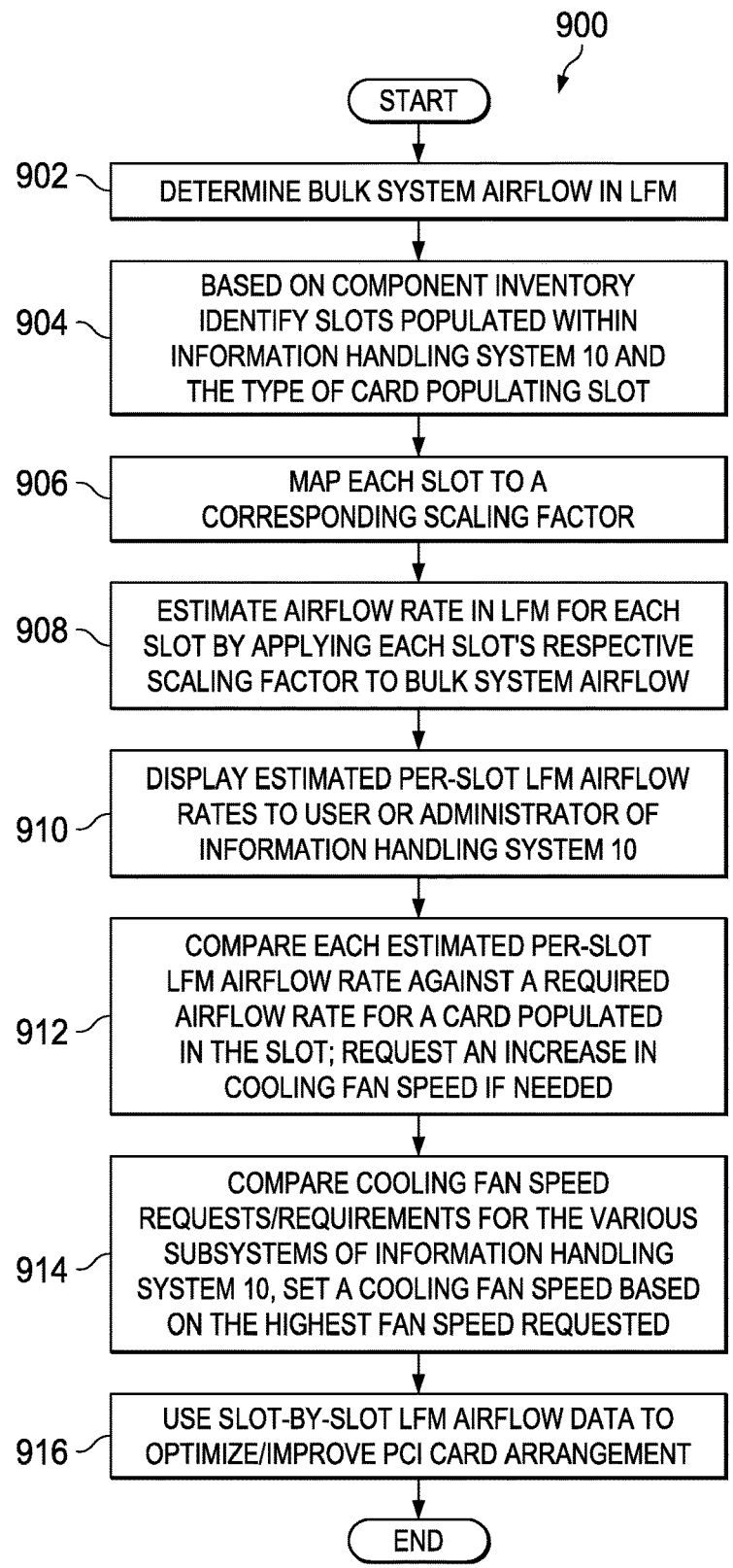
FIG. 9 illustrates a flow chart of an example method of slot-by-slot scaling of airflow in LFM and application thereof, in accordance with embodiments of the present disclosure.

FIG. 9 illustrates a flow chart of an example method 900 of slot-by-slot scaling of linear airflow rate in LFM and application thereof, in accordance with embodiments of the present disclosure. According to some embodiments, method 900 may begin at step 902. As noted above, teachings of the present disclosure may be implemented in a variety of configurations of information handling system 10. As such, the preferred initialization point for method 900 and the order of the steps comprising method 900 may depend on the implementation chosen.

At step 902, thermal manager 42 may determine a bulk (e.g., worst case or average) system airflow velocity in LFM. In some embodiments, such net system airflow velocity may be determined in accordance with energy balance data from table 52 in FIG. 5 to correlate speed of a cooling fan to airflow velocity in LFM, as described in greater detail above. In other embodiments, such net system airflow velocity may be determined based on a net system airflow in CFM and a net cross-sectional area for the airflow, as described above with respect to method 800. In yet other embodiments, such net system airflow velocity may be determined based on a correlation of PWM to linear airflow velocity for a particular (e.g., worst case) slot.

At step 904, thermal manager 42 may, based on a component inventory (e.g., as maintained by BMC 38), identify slots (e.g., PCI slots) populated within information handling system 10 and the type of PCI card populated (e.g., whether a card is low-profile or full-height, and/or a lane width of the card).

At step 906, based on this identification and known, estimated, or assumed characteristics of the inventoried components, thermal manager 42 may map each slot to a corresponding scaling factor. FIG. 10 illustrates a table mapping each slot to an associated scaling factor, in accordance with embodiments of the present disclosure. A scaling factor for a slot may be based on a location of the slot within information handling system 10, a form factor of a card populating a slot (e.g., low-profile or full-height), a lane width of a card populating a slot, and/or any other characteristic of the slot or a card populating such slot. In some embodiments, mathematical correlations between characteristics of a slot (e.g., location, form factor, lane width, etc.) and the slot's scaling factor may be made based on characterization testing of information handling system 10 (e.g., testing performed on a sample population of information handling systems 10 by a manufacturer, vendor, or other provider of information handling systems 10).

At step 908, thermal manager 42 may estimate a linear airflow velocity in LFM for each slot by applying each slot's respective scaling factor to the bulk system linear airflow velocity.

At step 910, in some embodiments, such estimated per-slot linear airflow velocities may be displayed to an administrator or other user of information handling system 10 (e.g., via a management console coupled to BMC 38).

At step 912, thermal manager 42 may compare each estimated per-slot linear airflow velocity against a required linear airflow velocity for a card populated in the slot, and if additional linear airflow velocity is required, thermal manager 42 may request an increase in cooling fan speed. In some embodiments, a fan speed required for a slot may be determined by applying its per-slot scaling factor to determine a bulk linear airflow velocity, and then convert such bulk linear airflow velocity to a corresponding cooling fan speed, as described above with respect to FIG. 7.

At step 914, thermal manager 42 may compare cooling fan speed requests/requirements for the various subsystems of information handling system 10, including a per-slot speed request/requirement as determined above, and set a cooling fan speed based on the highest fan speed requested.

At step 916, thermal manager 42 may use the slot-by-slot linear airflow velocity data and based thereon, recommend to an administrator or other user of information handling system 10 (e.g., via a management console coupled to BMC 38) an optimized or improved PCI card arrangement in the slots of PCI subsystem 32, either as a guide before an administrator or other user installs one or more cards or as an optimization/improvement for an already-populated PCI subsystem 32. In these and other embodiments, thermal manager 42 may create a dynamic slot priority list based on optimum cooling parameters that displays to an administrator or other user an optimum card placement based on real-time system configuration and ambient conditions. FIG. 11 illustrates a table wherein each row depicts an example configuration of populating three cards within six slots of a PCI subsystem and cooling fan speeds required to support such configuration, in accordance with embodiments of the present disclosure. Notably, in the second and third example configurations, in which either of CARD2 or CARD3 are populated in SLOT 1, cooling fans at their maximum speed would be unable to provide sufficient airflow to satisfy linear airflow velocity requirements of such configurations. Accordingly, if an administrator or other user configured a PCI subsystem in such manner, thermal manager 42 may issue an alert to such administrator or other user that such configuration is not supported by the thermal capabilities of information handling system 10. Also of note, the fourth configuration requires the least amount of power. Thus, where an administrator or other user has populated or plans to populate CARD1, CARD2, and CARD3 into a PCI subsystem, thermal manager 42 may, in accordance with method 900, recommend the fourth configuration to the administrator or other user.

After completion of step 916, method 900 may end.

Although FIG. 9 discloses a particular number of steps to be taken with respect to method 900, method 900 may be executed with greater or fewer steps than those depicted in FIG. 9. In addition, although FIG. 9 discloses a certain order of steps to be taken with respect to method 900, the steps comprising method 900 may be completed in any suitable order.

Method 900 may be implemented using one or more information handling systems 10, components thereof, and/or any other system operable to implement method 900. In certain embodiments, method 900 may be implemented partially or fully in software and/or firmware embodied in computer-readable media.

Although the foregoing methods and systems permit thermal control relating to components which have been qualified as to their cooling needs by a manufacturer, vendor, or other provider of information handling system 10, the methods and systems described above may alone be insufficient to apply the approaches thereof to components which have not been qualified.

Figure 12:
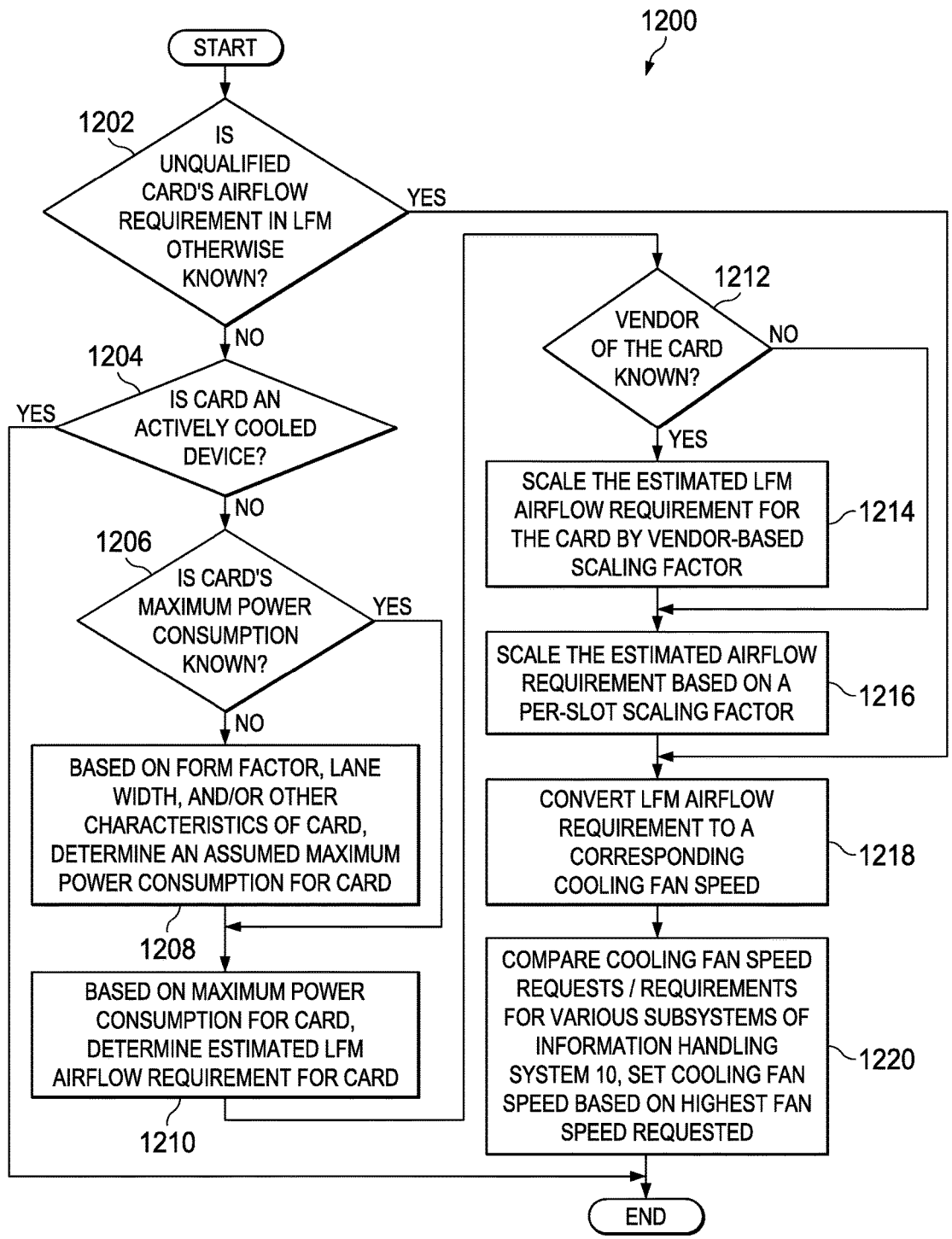
FIG. 12 illustrates a flow chart of an example method of performing thermal control of unqualified components, in accordance with embodiments of the present disclosure.

FIG. 12 illustrates a flow chart of an example method 1200 of performing thermal control of unqualified components, in accordance with embodiments of the present disclosure. According to some embodiments, method 1200 may begin at step 1202. As noted above, teachings of the present disclosure may be implemented in a variety of configurations of information handling system 10. As such, the preferred initialization point for method 1200 and the order of the steps comprising method 1200 may depend on the implementation chosen.

At step 1202, in response to a slot of PCI subsystem 32 being populated with a card which has not been qualified or characterized by a manufacturer, vendor, or other provider of information handling system 10, thermal manager 42 may determine if the card's airflow requirement in LFM is otherwise known. For example, such information might be obtained via a user interface wizard in which an administrator or other user of information handling system 10 enters information about the unqualified card. As another example, such information might be obtained from a configuration space (e.g., a PCI configuration space) or similar storage media integral to the card. As a further example, such information might come from a whitelist stored within BMC 38. If the card's airflow requirement is known, method 1200 may proceed to step 1218. Otherwise, method 1200 may proceed to step 1204.

At step 1204, thermal manager 42 may determine if the card is an actively cooled device which has its own cooling fan. For example, such information might be obtained via a user interface wizard in which an administrator or other user of information handling system 10 enters information about the unqualified card. As another example, such information might be obtained from a configuration space (e.g., a PCI configuration space) or similar storage media integral to the card. If the card is actively cooled, method 1200 may end as no additional fan cooling may be required for the card in addition to its active cooling system. Otherwise, method 1200 may proceed to step 1206.

At step 1206, thermal manager 42 may determine if the card's maximum power consumption is otherwise known. For example, such information might be obtained via a user interface wizard in which an administrator or other user of information handling system 10 enters information about the unqualified card. As another example, such information might be obtained from a configuration space (e.g., a PCI configuration space) or similar storage media integral to the card. If the card's airflow requirement is known, method 1200 may proceed to step 1210. Otherwise, method 1200 may proceed to step 1208.

At step 1208, in response to the LFM airflow requirement and maximum power consumption of the card being unknown, thermal manager 42 may, based on a form factor, lane width, and/or other characteristics of the card, determine an assumed maximum power consumption for such card. FIG. 13 illustrates a table with an example of mapping a form factor and lane width of a PCI card to an assumed maximum power consumption for such card, in accordance with embodiments of the present disclosure.

At step 1210, thermal manager 42 may, based on an assumed maximum power consumption for such card (as determined at step 1208) or a known maximum power consumption (as determined at step 1206) determine an estimated LFM airflow requirement for the card. In some embodiments, such determination may be made by correlating the maximum power assumption to the estimated LFM airflow based on one or more characteristics of the card, including a form factor of the card and a platform type of the information handling system in which the PCI card is installed. FIG. 14 illustrates a table for estimating an airflow requirement in LFM for a card based on maximum power consumptions for different form factors of a card and information handling system platform types for which such card may be installed, in accordance with embodiments of the present disclosure.

At step 1212, thermal manager 42 may determine whether a vendor of the card is known. For example, such information might be obtained via a user interface wizard in which an administrator or other user of information handling system 10 enters information about the unqualified card. As another example, such information might be obtained from a configuration space (e.g., a PCI configuration space) or similar storage media integral to the card. If a vendor of the card is known, method 1200 may proceed to step 1214. Otherwise, method 1200 may proceed to step 1216.

At step 1214, in response to the vendor of the card being known, thermal manager 42 may scale the estimated LFM airflow requirement for the card by a vendor-based scaling factor. Thus, while the estimated LFM airflow requirement as calculated at step 1210 may assume a "worst-case" vendor, scaling with a vendor-based scaling factor for known vendors with known general cooling requirements, thermal manager 42 may provide a better estimate of a true airflow requirement for the card than that of the worst-case estimate of step 1210. FIG. 15 illustrates a table mapping a plurality of card vendors and lane widths for cards of such vendors to an associated scaling factor, in accordance with embodiments of the present disclosure.

At step 1216, thermal manager 42 may scale the estimated airflow requirement (determined at step 1210 or step 1214) based on a per-slot scaling factor, in a manner similar to that of method 900. In some embodiments, such scaling may not be applied, and instead a bulk LFM airflow (e.g., determined at step 1210 or step 1214) may be used.

At step 1218, thermal manager 42 may determine from the LFM airflow requirement, whether a known airflow requirement (as determined at step 1202) or an estimated airflow requirement (as determined at step 1210, step 1214, or step 1216) a fan speed required for the unqualified card by converting such LFM airflow to a corresponding cooling fan speed, as described above with respect to FIG. 7.

At step 1220, thermal manager 42 may compare cooling fan speed requests/requirements for the various subsystems of information handling system 10, including a speed request/requirement for the unqualified card as determined above, and set a cooling fan speed based on the highest fan speed requested.

Although FIG. 12 discloses a particular number of steps to be taken with respect to method 1200, method 1200 may be executed with greater or fewer steps than those depicted in FIG. 12. In addition, although FIG. 12 discloses a certain order of steps to be taken with respect to method 1200, the steps comprising method 1200 may be completed in any suitable order.

Method 1200 may be implemented using one or more information handling systems 10, components thereof, and/or any other system operable to implement method 1200. In certain embodiments, method 1200 may be implemented partially or fully in software and/or firmware embodied in computer-readable media.

Thus, in accordance with method 1200, thermal manager 42 may, based on limited or incremental knowledge and/or information about an unqualified component, make the best estimation possible regarding the thermal behavior of such component.

The systems and methods described above may provide many advantages. For example, the systems and methods above may provide for determination of whether a required LFM flow rate for a card is supported by a thermal management system of an information handling system, and provide an alert if a card is not supported. As another example, the systems and methods allow for reporting to an administrator or other user real-time, system maximum and system minimum LFM airflow values within management interfaces of an information handling system 10, including on a slot-by-slot basis. As a further example, the systems and methods may enable setting of custom cooling fan speed options in terms of required LFM airflow, including on a slot-by-slot basis. Moreover, the systems and methods may allow for reporting of optimum card configurations in order to ensure that cards are inserted in slots for which adequate LFM airflow can be provided as well as optimizing power consumption based on slot-based determinations of required LFM airflow. Additionally, the systems and methods may allow for such advantages to be applied not only to cards that are qualified by a vendor, manufacturer, or other provider of an information handling system, but also to unqualified cards based on administrator or other user input or assumption regarding such cards.

Although the foregoing discusses cubic airflow in terms of cubic feet per minute, other units of measurement may be used (e.g., cubic meters per second). Also, although the foregoing discusses linear airflow velocity in terms of linear feet per minute, other units of measurement may be used (e.g., meters per second).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
   a plurality of temperature sensors configured to sense temperatures at a plurality of locations associated with an information handling system;
   a cooling subsystem comprising at least one cooling fan configured to generate a cooling airflow in the information handling system; and
   a thermal manager communicatively coupled to the plurality of temperature sensors and the cooling subsystem and configured to:

based on at least a power provided to a subsystem of the information handling system, estimate a thermal condition proximate to the subsystem; and set a speed of the at least one cooling fan based on the estimated thermal condition, a required linear airflow velocity associated with the subsystem, and a correlation between the required linear airflow velocity and the speed, the correlation being based on a component inventory of the information handling system.

2. The system of claim 1, wherein the required linear airflow velocity is set by a user of the information handling system.

3. The system of claim 1, wherein the estimated thermal condition comprises an ambient temperature within the subsystem.

4. The system of claim 1, wherein the estimated thermal condition comprises an inlet temperature of the subsystem.

5. The system of claim 1, wherein the subsystem comprises a plurality of slots each configured to receive a respective card.

6. The system of claim 5, wherein the required linear airflow velocity associated with the subsystem is a required linear airflow velocity of one of the plurality of slots.

7. The system of claim 6, wherein the required linear airflow velocity of the one of the plurality of slots is based on required linear airflow velocity for a worst case slot of the plurality of slots.

8. The system of claim 6, wherein the required linear airflow velocity of the one of the plurality of slots is based on at least whether the slot is populated with a respective card, a form factor of the respective card, and a lane width of the respective card.

9. The system of claim 6, wherein the required linear airflow velocity associated with the subsystem is an average required linear airflow velocity of one of the plurality of slots.

10. The system of claim 1, wherein the thermal manager is further configured to:
   determine if the at least one cooling fan is able to generate the required linear airflow velocity; and
   alert a user of the system if the at least one cooling fan is unable to generate the required linear airflow velocity.

11. A method comprising:
   sensing temperatures at a plurality of locations associated with an information handling system; and
   based on at least a power provided to a subsystem of the information handling system:
      estimating a thermal condition proximate to the subsystem; and
      setting a speed of at least one cooling fan of a cooling subsystem for generating a cooling airflow in the information handling system based on the estimated thermal condition, a required linear airflow velocity associated with the subsystem, and a correlation between the required linear airflow velocity and the speed, the correlation being based on a component inventory of the information handling system.

12. The method of claim 11, wherein the required linear airflow velocity is set by a user of the information handling system.

13. The method of claim 11, wherein the estimated thermal condition comprises an ambient temperature within the subsystem.

14. The method of claim 11, wherein the estimated thermal condition comprises an inlet temperature of the subsystem.

15. The method of claim 11, wherein the subsystem comprises a plurality of slots each configured to receive a respective card.

16. The method of claim 15, wherein the required linear airflow velocity associated with the subsystem is a required linear airflow velocity of one of the plurality of slots.

17. The method of claim 16, wherein the required linear airflow velocity of the one of the plurality of slots is based on a required linear airflow velocity for a worst case slot of the plurality of slots.

18. The method of claim 16, wherein the required linear airflow velocity of the one of the plurality of slots is based on at least whether the slot is populated with a respective card, a form factor of the respective card, and a lane width of the respective card.

19. The method of claim 16, wherein the required linear airflow velocity associated with the subsystem is an average required linear airflow velocity of one of the plurality of slots.

20. The method of claim 11, further comprising:
   determining if the at least one cooling fan is able to generate the required linear airflow velocity; and
   alerting a user of the information handling system if the at least one cooling fan is unable to generate the required linear airflow velocity.

* * * * *